US011444030B2

(12) United States Patent
Yang et al.

(10) Patent No.: US 11,444,030 B2
(45) Date of Patent: Sep. 13, 2022

(54) SEMICONDUCTOR DEVICE AND METHOD OF FORMING THE SAME

(71) Applicant: GLOBALFOUNDRIES Singapore Pte. Ltd., Singapore (SG)

(72) Inventors: Hyunwoo Yang, Singapore (SG); Naganivetha Thiyagarajah, Singapore (SG); De Wei Shawn Wong, Singapore (SG); Suk Hee Jang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 117 days.

(21) Appl. No.: 16/691,869

(22) Filed: Nov. 22, 2019

(65) Prior Publication Data

US 2021/0159184 A1    May 27, 2021

(51) Int. Cl.
*H01L 23/532* (2006.01)
*H01L 27/22* (2006.01)
*H01L 21/768* (2006.01)
*H01L 23/522* (2006.01)
*H01L 27/24* (2006.01)

(52) U.S. Cl.
CPC .. *H01L 23/53295* (2013.01); *H01L 21/76802* (2013.01); *H01L 23/5226* (2013.01); *H01L 27/222* (2013.01); *H01L 27/2463* (2013.01)

(58) Field of Classification Search
CPC .. H01L 27/2463; H01L 27/222; H01L 27/224
See application file for complete search history.

(56) References Cited

U.S. PATENT DOCUMENTS

| | | | |
|---|---|---|---|
| 6,261,893 B1 | 7/2001 | Chang et al. | |
| 9,406,875 B2 | 8/2016 | Li et al. | |
| 9,406,876 B2 | 8/2016 | Pinarbasi | |
| 9,564,577 B1 | 2/2017 | Hsu et al. | |
| 2017/0084822 A1* | 3/2017 | Kim | H01L 43/08 |
| 2017/0092693 A1* | 3/2017 | Tan | H01L 43/08 |
| 2018/0006085 A1* | 1/2018 | Chuang | H01L 43/12 |
| 2019/0165041 A1* | 5/2019 | Chuang | H01L 27/228 |
| 2019/0165258 A1* | 5/2019 | Peng | H01L 43/08 |
| 2020/0075669 A1* | 3/2020 | Chuang | H01L 43/02 |
| 2020/0135635 A1* | 4/2020 | Chen | H01L 23/53257 |
| 2021/0091139 A1* | 3/2021 | Tseng | H01L 43/08 |
| 2021/0134883 A1* | 5/2021 | Dutta | H01L 23/522 |

* cited by examiner

*Primary Examiner* — Peter M Albrecht
(74) *Attorney, Agent, or Firm* — Viering Jentschura & Partner mbB

(57) ABSTRACT

A semiconductor device may be provided, including a first dielectric layer having a first region and a second region laterally adjacent to the first region. The semiconductor device may further include a bottom electrode at least partially arranged within the first region of the first dielectric layer, a memory element arranged over the bottom electrode, a top electrode arranged over the memory element, and a second dielectric layer arranged over at least the first region of the first dielectric layer. The second dielectric layer may surround the memory element and may surround at least a part of the top electrode. The semiconductor device may further include a third dielectric layer arranged over the second region of the first dielectric layer and laterally adjacent to the second dielectric layer, and a conductive interconnect arranged in the third dielectric layer and the second region of the first dielectric layer.

18 Claims, 10 Drawing Sheets

SEMICONDUCTOR DEVICE AND METHOD OF FORMING THE SAME

TECHNICAL FIELD

The present disclosure relates generally to a semiconductor device and a method of forming a semiconductor device. In particular, the present disclosure relates to a memory device and a method of forming the memory device.

BACKGROUND

Semiconductor memories come in many types and have numerous applications, including various consumer electronics and computing devices. More recent developments in memory applications include magnetoresistive random-access memory (MRAM), resistive random access memory (ReRAM), phase change random-access memory (PCRAM), etc.

A memory device typically includes a number of individual memory cells that encode or store information. The individual memory cells are separated from one another so that they can be functionally isolated, which ensures that the memory cells do not interfere with one another. In certain cases, the memory cells are lined with an encapsulation layer. The space between adjacent lined memory cells may be filled with a space filling dielectric material. The encapsulation layer and the space filling dielectric material serve to isolate adjacent memory cells.

Memory cells may be integrated with various other circuit elements, such as transistors, passive components, and metal wires, etc. in a semiconductor package.

SUMMARY

According to various non-limiting embodiments, a semiconductor device may be provided. The semiconductor device may include a first dielectric layer having a first region and a second region laterally adjacent to the first region. The semiconductor device may further include a bottom electrode at least partially arranged within the first region of the first dielectric layer, a memory element arranged over the bottom electrode, a top electrode arranged over the memory element, and a second dielectric layer arranged over at least the first region of the first dielectric layer. The second dielectric layer may surround the memory element and may surround at least a part of the top electrode. The semiconductor device may further include a third dielectric layer arranged over the second region of the first dielectric layer and laterally adjacent to the second dielectric layer, and a conductive interconnect arranged in the third dielectric layer and the second region of the first dielectric layer.

According to various non-limiting embodiments, there may be provided a method of forming a semiconductor device. The method may include providing a first dielectric layer having a first region and a second region laterally adjacent to the first region. The method may further include forming a bottom electrode at least partially within the first region of the first dielectric layer, forming a memory element over the bottom electrode, forming a top electrode over the memory element, and forming a second dielectric layer over at least the first region of the first dielectric layer. The second dielectric layer may be formed to surround the memory element and surround at least a part of the top electrode. The method may further include forming a third dielectric layer over the second region of the first dielectric layer and laterally adjacent to the second dielectric layer, and forming a conductive interconnect arranged in the third dielectric layer and the second region of the first dielectric layer.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which.

DETAILED DESCRIPTION

Figure 1:
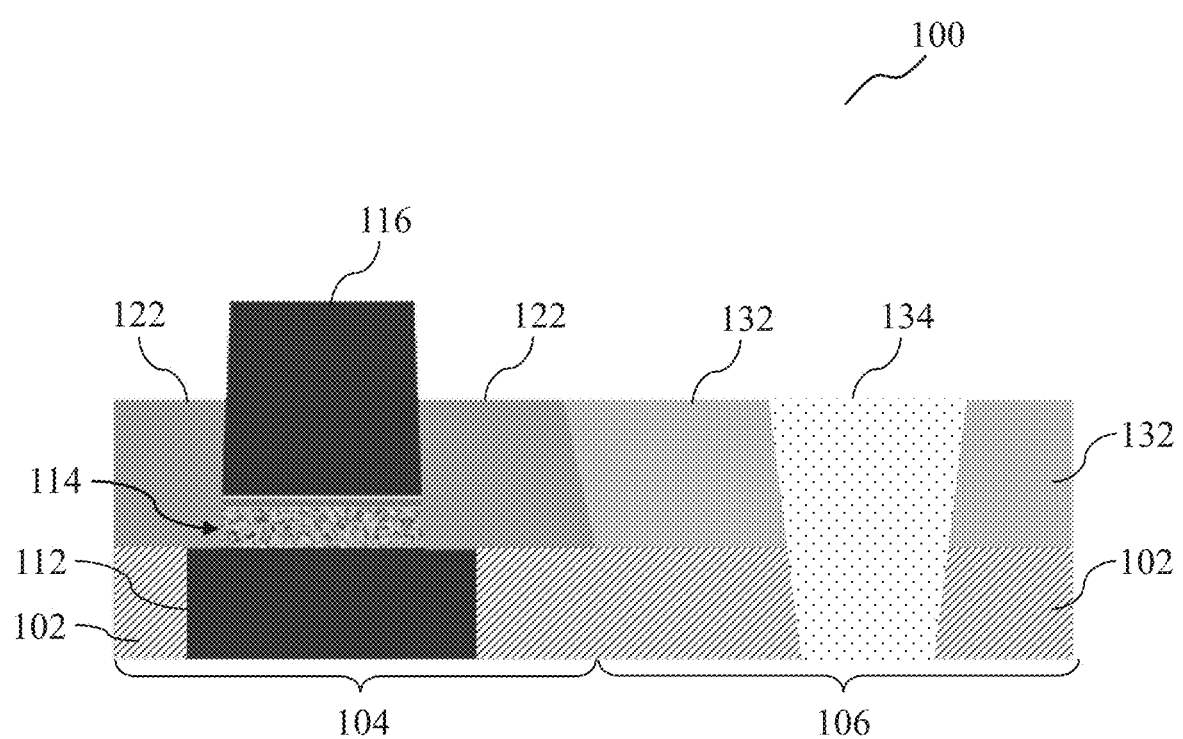
FIG. 1 shows a cross-sectional view of a semiconductor device according to various non-limiting embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

The term "connected" (or "coupled") herein, when used to refer to two physical elements, means a direct connection between the two physical elements or a connection through one or more intermediary elements.

It should be understood that the terms "on", "over", "under", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The non-limiting embodiments described below in context of the devices are analogously valid for the respective methods, and vice versa. Furthermore, it will be understood that the embodiments described below may be combined; for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

Various non-limiting embodiments relate to a semiconductor device, for example, a memory device.

FIG. 1 shows a cross-sectional view of a semiconductor device 100 according to various non-limiting embodiments.

As shown in FIG. 1, the semiconductor device 100 may include a first dielectric layer 102 having a first region 104 and a second region 106 laterally adjacent to the first region 104. The semiconductor device 100 may further include a bottom electrode 112 at least partially arranged within the first region 104 of the first dielectric layer 102, a memory element 114 arranged over the bottom electrode 112, a top electrode 116 arranged over the memory element 114, and a second dielectric layer 122 arranged over at least the first region 104 of the first dielectric layer 102. The second dielectric layer 122 may surround the memory element 114 and may surround at least a part of the top electrode 116. The semiconductor device 100 may further include a third dielectric layer 132 arranged over the second region 106 of the first dielectric layer 102 and laterally adjacent to the second dielectric layer 122, and a conductive interconnect 134 arranged in the third dielectric layer 132 and the second region 106 of the first dielectric layer 102.

According to various non-limiting embodiments, the first region 104 may be referred to as a memory region of the semiconductor device 100, where one or more memory elements may be arranged. The second region 106 may be referred to as a peripheral region or a logic region of the semiconductor device 100, where peripheral elements or logic elements, such as metal lines and interconnects, may be arranged. In various non-limiting embodiments, the conductive interconnect 134 may be a metal interconnect, and may include a via or a trench, for example.

In various non-limiting embodiments, the bottom electrode 112, the memory element 114 and the top electrode 116 may be referred to as a memory cell.

In various non-limiting embodiments, a top surface of the second dielectric layer 122 may be co-planar with a top surface of the third dielectric layer 132.

According to various non-limiting embodiments, the second dielectric layer 122 may be in contact with a side surface of the memory element 114 and a side surface of the top electrode 116. In other words, the second dielectric layer 122 may directly surround the memory element 114 and may directly surround at least a part of the top electrode 116, without any other layers or materials in-between.

According to various non-limiting embodiments, the second dielectric layer 122 may surround the entire height of the memory element 114, so that the second dielectric layer 122 may cover or encapsulate the memory element 114. According to various non-limiting embodiments, the second dielectric layer 122 may surround at least a part of the top electrode 116, e.g. at least one third of the height of the top electrode 116, so that the second dielectric layer 122 may at least partially encapsulate the top electrode 116 to provide sufficient isolation.

In various non-limiting embodiments, the second dielectric layer 122 may be referred to as an encapsulation layer, which may encapsulate the memory element 114 and the bottom electrode 112 and may at least partially encapsulate the top electrode 116, to prevent damages to the memory cell. In various non-limiting embodiments, the second dielectric layer 122 may also fill the space or gap between the memory cell and adjacent memory cells in the memory region 104. According to various non-limiting embodiments, the second dielectric layer 122 may be provided as a single void free layer which encapsulates the memory element 114 as well as fills the space between the memory cell and adjacent memory cells.

According to various non-limiting embodiments, the second dielectric layer 122 may be in contact with a top surface of the first dielectric layer 102. In other words, the second dielectric layer 122 may be arranged directly on at least the first region 104 of the first dielectric layer 102, without any other layers or materials inbetween.

In various non-limiting embodiments, a width of the bottom electrode 112 may be larger than a width of the memory element 114 and a width of the top electrode 116, as shown in the non-limiting embodiments of FIG. 1. In various non-limiting embodiments, the width of the bottom electrode 112 may be similar to or smaller than the width of the memory element 114. In various non-limiting embodiments, a width of the top electrode 116 may be similar to, larger than or smaller than the width of the memory element 114.

According to various non-limiting embodiments, the second dielectric layer 122 may be arranged over at least a part of the bottom electrode 112. In various non-limiting embodiments, the bottom electrode 112 may be wider than the memory element 114, and a part of the bottom electrode 112 may not be covered by the memory element 114. The second dielectric layer 122 may be arranged on the part of the bottom electrode 112 not being covered by the memory element 114, where the second dielectric layer 122 may be in contact with a top surface of the part of the bottom electrode 112 not being covered by the memory element 114.

According to various non-limiting embodiments, the third dielectric layer 132 may be in contact with a top surface of the first dielectric layer 102. In other words, the third dielectric layer 132 may be arranged directly on the second region 106 of the first dielectric layer 102, without any other layers or materials inbetween.

In various non-limiting embodiments, the first dielectric layer 102 may include one or more of tetraethoxysilane (TEOS), SiCOH, SiN, SiCN, $SiO_2$, or combinations thereof. The first dielectric layer 102 may be provided to isolate the bottom electrode 112, e.g. from bottom electrodes of adjacent memory cells in the memory region 104 and from the peripheral elements (e.g., the conductive interconnect 134) in the peripheral region 106.

In various non-limiting embodiments, the second dielectric layer 122 may include one or more of SiN, $SiO_yN_z$, $AlO_yN_z$, $TiO_yN_z$, $SiC_yN_z$, MgO, or combinations thereof, where $0 \leq y \leq 1$ and $0 \leq z \leq 1$. The second dielectric layer 122 may include a material which may be thermodynamically stable and may prevent oxygen diffusion into active material of the memory element 114 so as to protect the memory element 114 from damages.

In various non-limiting embodiments, the third dielectric layer 132 may include one or more of $SiO_2$, TEOS, SiCOH, or combinations thereof.

In various non-limiting embodiments, one or both of the bottom electrode 112 and the top electrode 116 may include one or more of Cu, Ta, TaN, W, Ti, TiN, alloys thereof, or combinations thereof.

Figure 2:
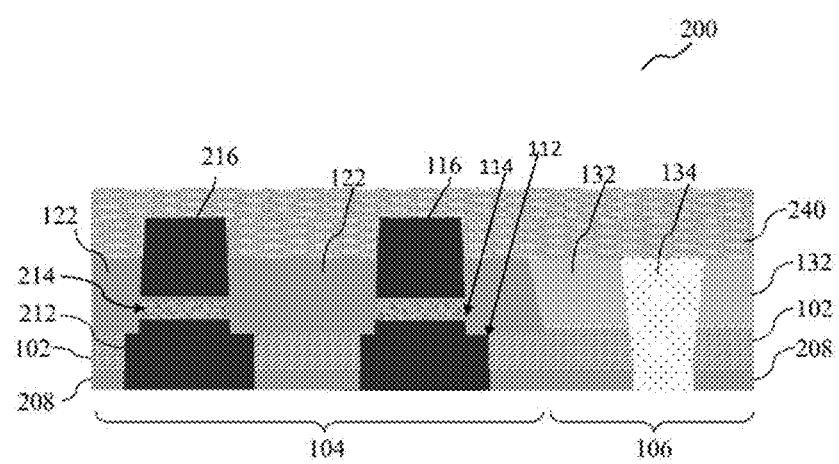
FIG. 2 shows a cross-sectional view of a semiconductor device according to various non-limiting embodiments.

According to various non-limiting embodiments, the semiconductor device 100 may further include a dielectric blocking layer (as shown in FIG. 2) arranged under the first dielectric layer 102, where the bottom electrode 112 and the conductive interconnect 134 may extend through the dielectric blocking layer. In various non-limiting embodiments, the conductive interconnect 134 may include a via or a trench which may extend through the dielectric blocking layer, for example, to make contact with metal lines arranged under the dielectric blocking layer. In a non-limiting embodiment, the dielectric blocking layer may include SiN. The dielectric blocking layer may be provided to block the diffusion of the dielectric material from the first dielectric layer 102 to the underlying layers, such as a substrate.

According to various non-limiting embodiments, the semiconductor device 100 may further include a further bottom electrode (not shown in FIG. 1) at least partially arranged within the first region 104 of the first dielectric layer 102, a further memory element (not shown in FIG. 1) arranged over the further bottom electrode, and a further top electrode (not shown in FIG. 1) arranged over the further memory element. The further bottom electrode, the further memory element and the further top electrode may form a further memory cell. The second dielectric layer 122 may be arranged surrounding the further memory element and surrounding at least a part of the further top electrode. The second dielectric layer 122 may be arranged to fill a space between the memory element 114 and the further memory element and to at least partially fill a space between the top electrode 116 and the further top electrode.

According to various non-limiting embodiments, the semiconductor device 100 may further include a metal layer (not shown in FIG. 1) covering the top electrode 116, the second dielectric layer 122, the third dielectric layer 132, and the conductive interconnect 134. The metal layer may include one or more trenches formed over the second dielectric layer 122 and the third dielectric layer 132 and filled with metal.

According to various non-limiting embodiments, the memory element 114 may include a magnetoresistive random access memory (MRAM), a phase change random access memory (PCRAM), a resistive random access memory (ReRAM), a ferroelectric random access memory (FeRAM), or any other suitable types of memories. In a non-limiting embodiment, the memory element 114 may include a MRAM element, e.g. a STT (spin transfer torque) MRAM element, which may include a reference layer and a free layer separated by a barrier layer. The MRAIVI element may include additional layers, such as antiferromagnetic layers and/or a hard mask. In another non-limiting embodiment, the memory element 114 may include a ReRAM element, which may include a resistive layer having a material configured to provide variable resistances upon application of a voltage bias. Accordingly, the semiconductor device 100 may be a MRAIVI device, a PCRAM device, a ReRAM device, or a FeRAM device.

FIG. 2 shows a cross-sectional view of a semiconductor device 200 according to various non-limiting embodiments.

The semiconductor device 200 is similar to the semiconductor device 100 of FIG. 1, and thus the common features are labeled with the same reference numerals. Various embodiments described with reference to FIG. 1 are analogously valid for the semiconductor device 200 of FIG. 2, and vice versa.

Similar to the semiconductor device 100, the semiconductor device 200 may include the first dielectric layer 102 having the first region 104 and the second region 106 laterally adjacent to the first region 104. The semiconductor device 200 may further include the bottom electrode 112 at least partially arranged within the first region 104 of the first dielectric layer 102, the memory element 114 arranged over the bottom electrode 112, the top electrode 116 arranged over the memory element 114, and the second dielectric layer 122 arranged over at least the first region 104 of the first dielectric layer 102. The second dielectric layer 122 may surround the memory element 114 and may surround at least a part of the top electrode 116. The semiconductor device 200 may further include the third dielectric layer 132 arranged over the second region 106 of the first dielectric layer 102 and laterally adjacent to the second dielectric layer 122, and the conductive interconnect 134 arranged in the third dielectric layer 132 and the second region 106 of the first dielectric layer 102.

Different from the semiconductor device 100 shown in FIG. 1, the semiconductor device 200 may further include a further bottom electrode 212 at least partially arranged within the first region 104 of the first dielectric layer 102, a further memory element 214 arranged over the further bottom electrode 212, and a further top electrode 216 arranged over the further memory element 214. The further bottom electrode 212, the further memory element 214 and the further top electrode 216 may form a further memory cell. The second dielectric layer 122 may be arranged surrounding the further memory element 214 and surrounding at least a part of the further top electrode 216. The second dielectric layer 122 may be arranged to fill a space between the memory element 114 and the further memory element 214 and to at least partially fill a space between the top electrode 116 and the further top electrode 216.

Similar to the non-limiting embodiments described with reference to FIG. 1, the second dielectric layer 122 may be in contact with a side surface of the further memory element 214 and a side surface of the further top electrode 216. In other words, the second dielectric layer 122 may directly surround the further memory element 214 and may directly surround at least a part of the further top electrode 216, without any other layers or materials inbetween.

According to various non-limiting embodiments, the second dielectric layer 122 may surround the entire height of the further memory element 214, so that the second dielectric layer 122 may cover or encapsulate the further memory element 214. According to various non-limiting embodiments, the second dielectric layer 122 may surround at least a part of the further top electrode 216, e.g. at least one third of the height of the further top electrode 216, so that the second dielectric layer 122 may at least partially encapsulate the further top electrode 216 to provide sufficient isolation.

In various non-limiting embodiments, the second dielectric layer 122 may encapsulate the further memory element 214 and the further bottom electrode 212 and may at least partially encapsulate the further top electrode 216, to prevent damages to the further memory cell. In various non-limiting embodiments, the second dielectric layer 122 may also fill the space or gap between the memory cell and further memory cell in the memory region 104. According to various non-limiting embodiments, the second dielectric layer 122 may be provided as a single void free layer which encapsulates the memory element 114 and the further memory element 214, and at the same time fills the space between the memory cell and adjacent memory cells.

In various non-limiting embodiments, a width of the further bottom electrode 212 may be larger than a width of the further memory element 214 and a width of the further top electrode 216, as shown in the non-limiting embodiments of FIG. 2. In various non-limiting embodiments, the width of the further bottom electrode 212 may be similar to or smaller than the width of the further memory element 214. In various non-limiting embodiments, a width of the further top electrode 216 may be similar to, larger than or smaller than the width of the further memory element 214.

According to various non-limiting embodiments, the second dielectric layer 122 may be arranged over at least a part of the further bottom electrode 212. In various non-limiting embodiments, the further bottom electrode 212 may be wider than the further memory element 214, and a part of the further bottom electrode 212 may not be covered by the further memory element 214. The second dielectric layer 122 may be arranged on the part of the further bottom electrode 212 not being covered by the further memory element 214, where the second dielectric layer 122 may be in contact with a top surface of the part of the further bottom electrode 212 not being covered by the further memory element 214.

In various non-limiting embodiments, the first dielectric layer 102 may include one or more of tetraethoxysilane (TEOS), SiCOH, SiN, SiCN, $SiO_2$, or combinations thereof. The first dielectric layer 102 may be provided to isolate the bottom electrode 112 from the further bottom electrode 212 in the memory region 104, and to isolate the bottom electrodes 112, 122 from the peripheral elements (e.g., the conductive interconnect 134) in the peripheral region 106.

In various non-limiting embodiments, the second dielectric layer 122 may include one or more of SiN, $SiO_yN_z$, $AlO_yN_z$, $TiO_yN_z$, $SiC_yN_z$, MgO, or combinations thereof, where $0 \leq y \leq 1$ and $0 \leq z \leq 1$. The second dielectric layer 122 may include a material which may be thermodynamically stable and may prevent oxygen diffusion into active material of the further memory element 214 so as to protect the further memory element 214 from damages.

In various non-limiting embodiments, one or both of the further bottom electrode 212 and the further top electrode 216 may include one or more of Cu, Ta, TaN, W, Ti, TiN, alloys thereof, or combinations thereof.

According to various non-limiting embodiments of FIG. 2, the semiconductor device 200 may further include an optional dielectric blocking layer 208 arranged under the first dielectric layer 102, where the bottom electrode 112, the further bottom electrode 212 and the conductive interconnect 134 may extend through the dielectric blocking layer 208. In various non-limiting embodiments as shown in FIG. 2, the conductive interconnect 134 may include a via or a trench which may extend through the dielectric blocking layer 208, for example, to make contact with metal lines arranged under the dielectric blocking layer 208. In a non-limiting embodiment, the dielectric blocking layer 208 may include SiN. The dielectric blocking layer 208 may be provided to block the diffusion of the dielectric material from the first dielectric layer 102 to the underlying layers, such as a substrate.

According to various non-limiting embodiments, the semiconductor device 200 may further include a metal layer 240 covering the top electrode 116, the further top electrode 216, the second dielectric layer 122, the third dielectric layer 132, and the conductive interconnect 134. The metal layer 240 may include one or more trenches formed over the second dielectric layer 122 and the third dielectric layer 132 and filled with metal. In various non-limiting embodiments, the trenches of the metal layer 240 and the conductive interconnect 134 (e.g., via) may be filled with metal in a dual damascene process. Accordingly, the trench may be referred to as a dual damascene logic trench, and the via 134 may be referred to as a dual damascene logic via.

Similar to the memory element 114, the further memory element 214 may include a MRAM, a PCRAM, a ReRAM, or a FeRAM. Accordingly, the semiconductor device 200 may be a MRAM device, a PCRAM device, a ReRAM device, or a FeRAM device. Although the non-limiting embodiments of FIG. 2 shows the memory element 114 and the further memory element 214 along with associated electrodes, it is understood that the semiconductor device 200 may include more than two memory elements and associated electrodes. According to various non-limiting embodiments, the semiconductor device 200 may be a memory device including a plurality of memory elements and associated electrodes, which may be arranged in an array (e.g., 4×4, 16×16, 64×64, 256×256, etc.) in the memory region of the semiconductor device 200 and may be laterally spaced apart from each other via the second dielectric layer 122.

In the following, a method of forming the semiconductor device 100, 200, according to various non-limiting embodiments will be described.

Figure 3A:
FIG. 3A shows a flowchart illustrating a method of forming a semiconductor device according to various non-limiting embodiments.

FIG. 3A shows a flowchart 300 illustrating a method of forming a semiconductor device according to various non-limiting embodiments. The method may be used to form the semiconductor device 100, 200 described in various non-limiting embodiments above. Various non-limiting embodiments described in context of the semiconductor device 100, 200 above are analogously valid for the respective method, and vice versa.

At 302, a first dielectric layer having a first region and a second region laterally adjacent to the first region may be provided.

At 304, a bottom electrode may be formed at least partially within the first region of the first dielectric layer.

At 306, a memory element may be formed over the bottom electrode.

At 308, a top electrode may be formed over the memory element.

At 310, a second dielectric layer may be formed over at least the first region of the first dielectric layer, where the second dielectric layer may be formed to surround the memory element and surround at least a part of the top electrode.

At 312, a third dielectric layer may be formed over the second region of the first dielectric layer and laterally adjacent to the second dielectric layer.

At 314, a conductive interconnect may be formed in the third dielectric layer and the second region of the first dielectric layer.

According to various non-limiting embodiments, the second dielectric layer and the third dielectric layer may be formed such that a top surface of the second dielectric layer is co-planar with a top surface of the third dielectric layer. In various embodiments, the top surface of the second dielectric layer and the top surface of the third dielectric layer may be planarized.

According to various non-limiting embodiments, forming the second dielectric layer at 310 may further include forming an initial second dielectric layer over the first region and the second region of the first dielectric layer, etching back a portion of the initial second dielectric layer over the first region to form the second dielectric layer surrounding the memory element and surrounding at least a part of the top electrode, and etching back the initial second dielectric layer over the second region to expose the second region of the first dielectric layer. In various embodiments, the initial second dielectric layer over the second region may be removed, such that the second dielectric layer formed thereof is absent over the second region, prior to the formation of the third dielectric layer at 312.

In various non-limiting embodiments, forming the initial second dielectric layer may include forming the initial second dielectric layer over the bottom electrode, the memory element, and the top electrode with a step coverage larger than 80%. The step coverage may refer to the minimum thickness of the initial second dielectric layer formed on the side of a step (e.g., on the side of the bottom electrode, the memory element and the top electrode), divided by the thickness of the initial second dielectric layer formed on the top horizontal surface of the top electrode. In various non-limiting embodiments, the initial second dielectric layer may be conformally formed over the bottom electrode, the memory element, and the top electrode, with a step coverage of about 100%, for example.

In various non-limiting embodiments, forming the initial second dielectric layer may include forming the initial second dielectric layer with a thickness substantially larger than a spacing between the memory element and an adjacent memory element. In various non-limiting embodiments, the initial second dielectric layer may be formed with a thickness 1.2 times thicker than the largest spacing between the memory element and the adjacent memory element.

In various embodiments, the step coverage of the initial second dielectric layer may be higher than 80%, and the initial second dielectric layer may be 1.2 times thicker than the largest space between the memory elements, so as to form void free coverage by the initial second dielectric layer. After formation, the initial second dielectric layer may cover the top electrode, the memory element and the bottom electrode.

In various non-limiting embodiments, the initial second dielectric layer may be formed via cyclic or pulse mode deposition, which may increase the step coverage and prevent voids. Accordingly, the method of various non-limiting embodiments may enable the formation of the initial second dielectric layer with a step coverage of higher than 80% and may enable the formation of a void free initial second dielectric layer. In a non-limiting embodiment, the cyclic mode deposition may include atomic layer deposition. In a non-limiting embodiment, the pulse mode deposition may include pulsed plasma chemical vapor deposition. In various non-limiting embodiments, the initial second dielectric layer may be formed in a deposition process using gases, such as $N_2$, $SiH_4$, or $NH_3$. In various non-limiting embodiments, the initial second dielectric layer may be formed under a low temperature of less than 350° C. to reduce thermal budget of the active layer of the memory element.

According to various non-limiting embodiments, after etching back a portion of the initial second dielectric layer over the first region, the second dielectric layer may be formed to cover the memory element and the bottom electrode. The top surface of the top electrode may or may not be covered by the second dielectric layer. After etching back the initial second dielectric layer over the second region, the second region of the first dielectric layer is not covered by the second dielectric layer.

According to various non-limiting embodiments, a high selectivity of oxide to initial second dielectric layer (e.g., >10:1) may be provided during the etching back process. In various non-limiting embodiments, the etching back process may include reactive ion etching (RIE) process using $CH_3$, $CF_4$, $CHF_3$, $C_4F_8$ or similar gases.

According to various non-limiting embodiments, the etching back process may remove the initial second dielectric layer on top of the top electrode as well as on the logic region. In various non-limiting embodiments, a selectivity of higher than 12:1 may be provided, which may leave sufficient first dielectric layer remaining in the second region of the semiconductor device, after etching back the initial second dielectric layer over the second region. There may be no other materials, such as stop layers, protective layers or other dielectrics formed to protect the memory element at the end of the etch back process.

Figure 3B:
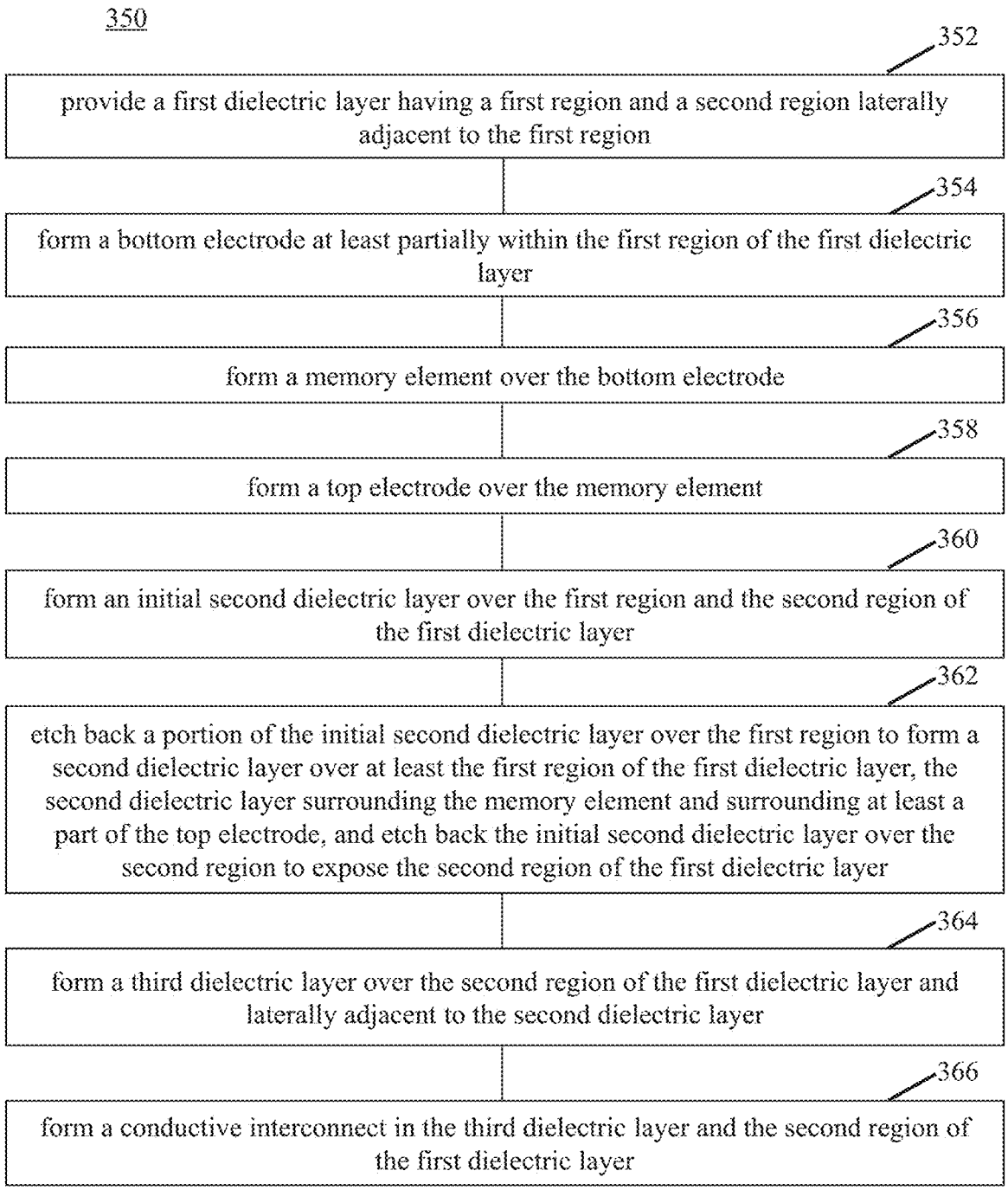
FIG. 3B shows a flowchart illustrating a method of forming a semiconductor device according to various non-limiting embodiments.

FIG. 3B shows a flowchart 350 illustrating a method of forming a semiconductor device according to various non-limiting embodiments. The method may be used to form the semiconductor device 100, 200 described in various non-limiting embodiments above. Various non-limiting embodiments described in context of the semiconductor device 100, 200 and the method 300 of FIG. 3A above are analogously valid for the method of FIG. 3B, and vice versa.

At 352, a first dielectric layer having a first region and a second region laterally adjacent to the first region may be provided.

At 354, a bottom electrode may be formed at least partially within the first region of the first dielectric layer.

At 356, a memory element may be formed over the bottom electrode.

At 358, a top electrode may be formed over the memory element.

At 360, an initial second dielectric layer may be formed over the first region and the second region of the first dielectric layer.

In various non-limiting embodiments, the initial second dielectric layer may be formed over the bottom electrode, the memory element, and the top electrode with a step coverage larger than 80%. The step coverage may refer to the minimum thickness of the initial second dielectric layer formed on the side of a step (e.g., on the side of the bottom electrode, the memory element and the top electrode), divided by the thickness of the initial second dielectric layer formed on the top horizontal surface of the top electrode. In various non-limiting embodiments, the initial second dielectric layer may be conformally formed over the bottom electrode, the memory element, and the top electrode, with a step coverage of about 100%, for example.

In various non-limiting embodiments, the initial second dielectric layer may be formed with a thickness substantially larger than a spacing between the memory element and an adjacent memory element. In various non-limiting embodiments, the initial second dielectric layer may be formed with a thickness 1.2 times thicker than the largest spacing between the memory element and the adjacent memory element.

In various embodiments, the step coverage of the initial second dielectric layer may be higher than 80%, and the initial second dielectric layer may be 1.2 times thicker than the largest space between the memory elements, so as to form void free coverage by the initial second dielectric layer. After formation, the initial second dielectric may cover the top electrode, the memory element and the bottom electrode.

In various non-limiting embodiments, the initial second dielectric layer may be formed via cyclic or pulse mode deposition, which may increase the step coverage and prevent voids. Accordingly, the method of various non-limiting embodiments may enable the formation of the initial second dielectric layer with a step coverage of higher than 80% and may enable the formation of a void free initial second dielectric layer. In a non-limiting embodiment, the cyclic mode deposition may include atomic layer deposition. In a non-limiting embodiment, the pulse mode deposition may include pulsed plasma chemical vapor deposition. In various non-limiting embodiments, the initial second dielectric layer may be formed in a deposition process using gases, such as $N_2$, $SiH_4$, or $NH_3$. In various non-limiting embodiments, the initial second dielectric layer may be formed under a low temperature of less than 350° C. to reduce thermal budget of the active layer of the memory element.

At 362, a portion of the initial second dielectric layer over the first region may be etched back to form the second dielectric layer over at least the first region of the first dielectric layer, where the second dielectric layer may be formed to surround the memory element and surround at least a part of the top electrode. The initial second dielectric layer over the second region may be etched back to expose the second region of the first dielectric layer.

In various embodiments, the initial second dielectric layer over the second region may be entirely removed, such that the second dielectric layer formed thereof is absent in the second region, prior to the formation of a third dielectric layer at 364 below.

According to various non-limiting embodiments, after etching back a portion of the initial second dielectric layer over the first region, the second dielectric layer may be formed to cover the memory element and the bottom electrode. The top surface of the top electrode may or may not be covered by the second dielectric layer. After etching back the initial second dielectric layer over the second region, the second region of the first dielectric layer is not covered by the second dielectric layer.

According to various non-limiting embodiments, a high selectivity of oxide to initial second dielectric layer (e.g., >10:1) may be provided during the etching back process. In various non-limiting embodiments, the etching back process may include reactive ion etching (RIE) process using $CH_3$, $CF_4$, $CHF_3$, $C_4F_8$ or similar gases.

According to various non-limiting embodiments, the etching back process may remove the initial second dielectric layer on top of the top electrode as well as on the logic region. In various non-limiting embodiments, a selectivity of higher than 12:1 may be provided, which may leave sufficient first dielectric layer remaining in the second region of the semiconductor device, after etching back the initial second dielectric layer over the second region. There may be no other materials, such as stop layers, protective layers or other dielectrics formed to protect the memory element at the end of the etch back process.

At 364, a third dielectric layer may be formed over the second region of the first dielectric layer and laterally adjacent to the second dielectric layer.

At 366, a conductive interconnect may be formed in the third dielectric layer and the second region of the first dielectric layer.

According to various non-limiting embodiments, the second dielectric layer and the third dielectric layer may be formed such that a top surface of the second dielectric layer is co-planar with a top surface of the third dielectric layer. In various embodiments, the top surface of the second dielectric layer and the top surface of the third dielectric layer may be planarized.

Various non-limiting embodiments of the method of forming the semiconductor device will be described in more detail below.

FIGS. 4A-4J illustrate a method of forming a semiconductor device according to various non-limiting embodiments.

In the non-limiting embodiments of FIGS. 4A-4J, the method of forming the semiconductor device 200 is illustrated. Various non-limiting embodiments described in context of the semiconductor device 100, 200 of FIG. 1 and FIG. 2 and the method of FIG. 3A and FIG. 3B are analogously valid for the method of FIGS. 4A-4J, and vice versa.

Figure 4A:
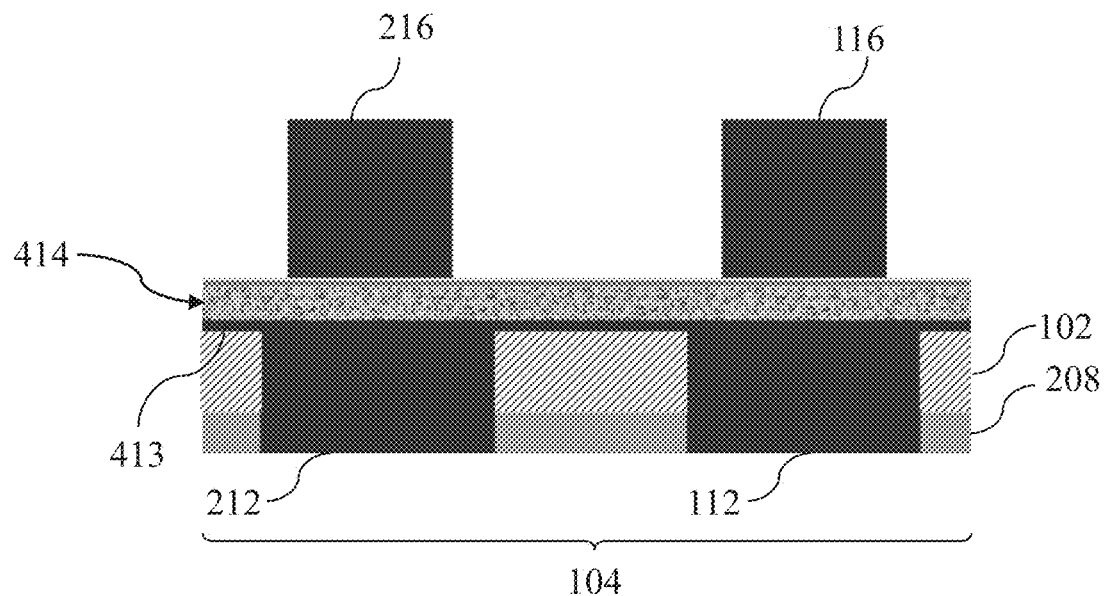
FIGS. 4A to 4J illustrate a method of forming a semiconductor device according to various non-limiting embodiments.

As shown in FIG. 4A, the first dielectric layer 102 having the first region 104 and the second region (106 not shown in FIG. 4A) laterally adjacent to the first region 104 may be provided on the dielectric blocking layer 208, wherein only the first region 104 is shown in FIG. 4A. The bottom electrode 112 and the further bottom electrode 212 may be at least partially arranged within the first region 104 of the first dielectric layer 102.

In various non-limiting embodiments, a planarization or seed layer 413 may be optionally provided on the first dielectric layer 102, the bottom electrode 112 and the further bottom electrode 212. The planarization or seed layer 413 may include a thin metal layer, serving as a planarization layer/seed layer for the growth of memory elements thereon.

In various non-limiting embodiments, a memory layer arrangement 414 may be arranged on the planarization/seed layer 413 where the planarization/seed layer 413 is present. It is understood that the memory layer arrangement 414 may be directly arranged on the first dielectric layer 102, the bottom electrode 112 and the further bottom electrode 212 where the planarization or seed layer 413 is absent. In various non-limiting embodiments, the memory layer arrangement 414 may be a single memory layer or may be a plurality of memory layers. In a non-limiting embodiment, the memory layer arrangement 414 may include a reference layer and a free layer separated by a barrier layer, to form a MRAM element. In another non-limiting embodiment, the memory layer arrangement 414 may include a resistive layer having a material configured to provide variable resistances upon application of a voltage bias, to form a ReRAM element.

According to various non-limiting embodiments of FIG. 4A, a top electrode layer may be formed over the memory layer arrangement 414, and a hard mask etching may be performed over the top electrode layer, to form the top electrode 116 and the further top electrode 216 over the memory layer arrangement 414.

Figure 4B:
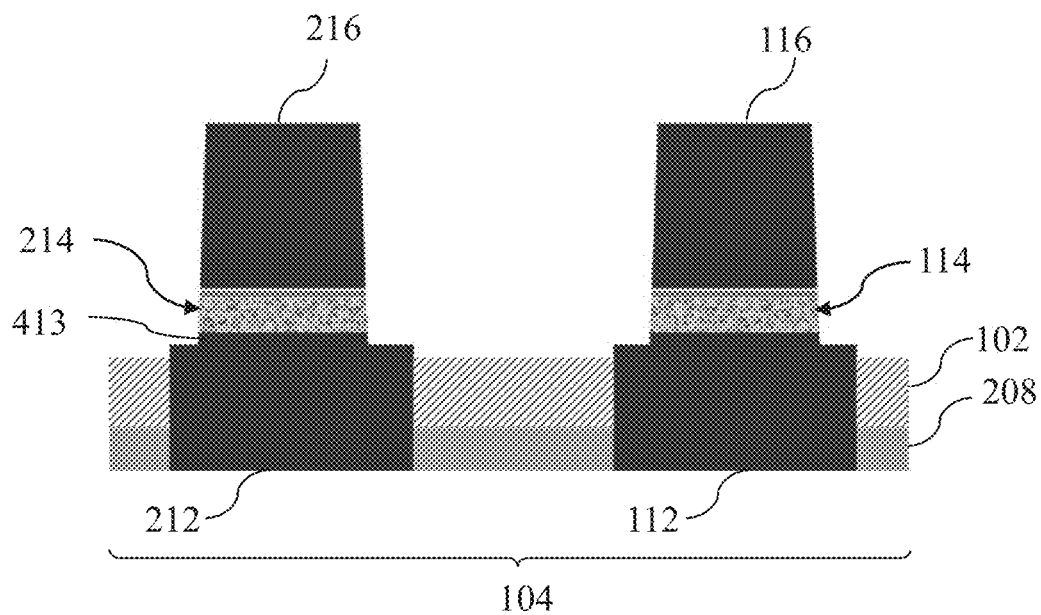

In FIG. 4B, ion beam etching (IBE) may be performed to etch at least a part of the memory layer arrangement 414 to form the memory element 114 and the further memory element 214. At least a part of the top electrode 116, 216 and at least a part of the planarization/seed layer 413 may also be etched, to form the memory element 114, 214 and the top electrode 116, 216 aligned with each other along the side wall. For example, the memory element 114, 214 and the top electrode 116, 216 may be aligned to have a triangular or trapezoidal cross-section in a non-limiting embodiment. The etching may be performed to etch the memory layer arrangement 414 and the top electrode 116, 216, such that the width of the memory element 114, 214 and the width of the top electrode 116, 216 are smaller than the width of the bottom electrode 112, 212. In other non-limiting embodiments, the memory element 114, 214 and the top electrode 116, 216 may be aligned to have a rectangular cross-section, where the widths of the memory element 114, 214, the top electrode 116, 216 and the bottom electrode 112, 212 may be similar to each other.

In various non-limiting embodiments, the etching may not be performed on the bottom electrode 112, 212, so that the bottom electrode 112, 212 is kept intact. In various non-limiting embodiments, a top surface of the bottom electrode 112, 212 may be etched away, to form a step at the top side of the bottom electrode 112, 212, as illustrated in FIG. 4B and the following figures.

According to various non-limiting embodiments of FIG. 4B, the memory stack or the memory cell including the bottom electrode 112, 212, the memory element 114, 214, and the top electrode 116, 216 may be formed.

In various non-limiting embodiments as described herein with reference to FIGS. 4A-4J, two memory cells are illustrated. It is understood that the method according to various non-limiting embodiments may be used to form any number of memory cells in the semiconductor device 200. The non-limiting embodiments described with reference to FIGS. 4A-4J may also be used to form the memory device 100 of FIG. 1, where one memory cell is formed in the semiconductor device 100.

Figure 4C:
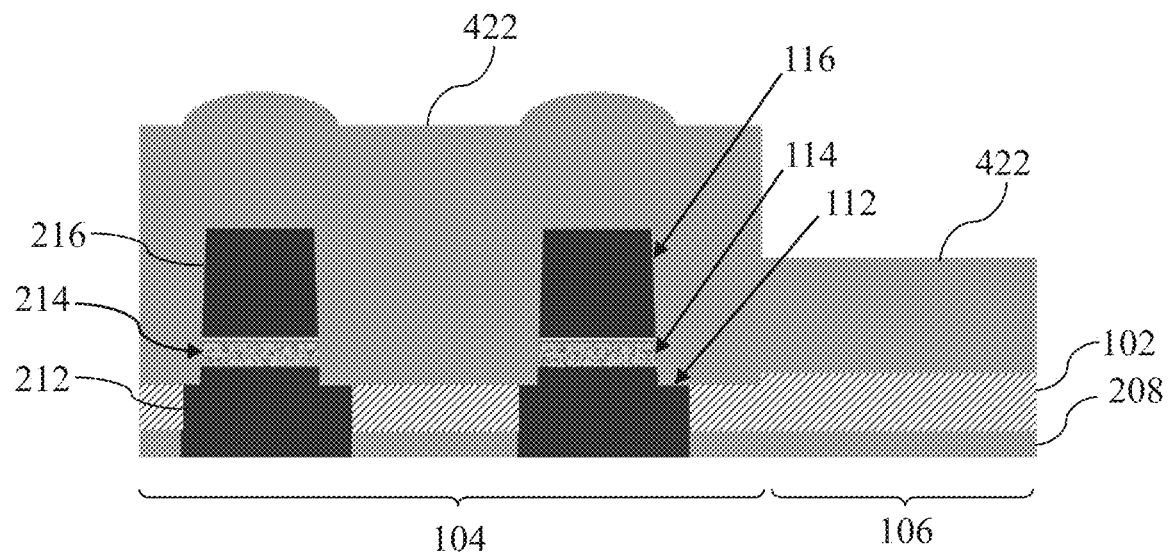

In FIG. 4C, an initial second dielectric layer 422 may be formed over the first region 104 and the second region 106 of the first dielectric layer 102. The initial second dielectric layer 422 may include one or more of SiN, $SiO_yN_z$, $AlO_yN_z$, $TiO_yN_z$, $SiC_yN_z$, MgO, or combinations thereof.

In various non-limiting embodiments, the initial second dielectric layer 422 may be formed over the bottom electrode 112, 212, the memory element 114, 214, and the top electrode 116, 216 with a step coverage larger than 80%. In various non-limiting embodiments, the initial second dielectric layer 422 may be conformally formed over the bottom electrode 112, 212, the memory element 114, 214, and the top electrode 116, 216, with a step coverage of about 100%, for example.

In various non-limiting embodiments, the initial second dielectric layer 422 may be formed with a thickness substantially larger than a spacing between the memory element 114 and the adjacent further memory element 214. In various non-limiting embodiments, the initial second dielectric layer may be formed with a thickness 1.2 times thicker than the largest spacing between the memory element 114 and the adjacent memory element 214.

According to various non-limiting embodiments, the step coverage of the initial second dielectric layer 422 may be higher than 80%, and the initial second dielectric layer 422 may be 1.2 times thicker than the largest space between the memory elements 114, 214, so as to form the initial second dielectric layer 422 which is void free.

After formation, the initial second dielectric layer 422 may cover the bottom electrode 112, 212, the memory element 114, 214, and the top electrode 116, 216 in the first region 104. The initial second dielectric layer 422 may also cover the second region 106 of the first dielectric layer 102, as shown in FIG. 4C. Due to the height difference between the memory region 104 and the peripheral/logic region 106, the initial second dielectric layer 422 may have different height in the memory region 104 and the peripheral/logic region 106.

Figure 5:
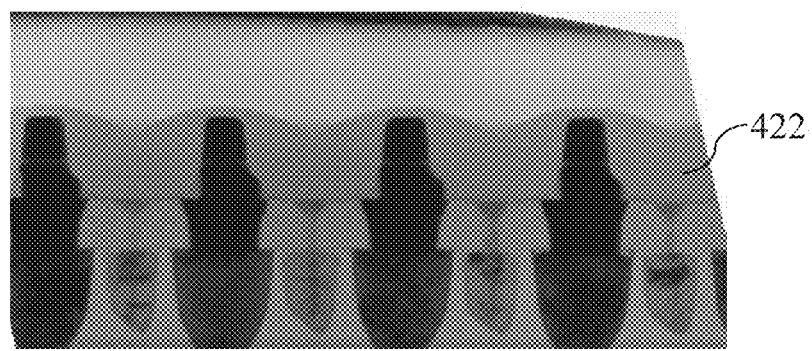
FIG. 5 shows a cross-sectional view SEM image of a semiconductor device which may be formed according to the non-limiting embodiments of FIG. 4C.

In various non-limiting embodiments, the initial second dielectric layer 422 may be formed via cyclic or pulse mode deposition, which may increase the step coverage and prevent voids. Accordingly, the method of various non-limiting embodiments may enable the formation of the initial second dielectric layer 422 with a step coverage of higher than 80% and may enable the formation of a void free initial second dielectric layer. FIG. 5 shows a cross-sectional view SEM image of the semiconductor device formed according to the non-limiting embodiments of FIG. 4C. As shown in FIG. 5, the thick initial second dielectric layer 422 is formed which is voidless.

In a non-limiting embodiment, the cyclic mode deposition may include atomic layer deposition. In a non-limiting embodiment, the pulse mode deposition may include pulsed plasma chemical vapor deposition. In various non-limiting embodiments, the initial second dielectric layer 422 may be formed in a deposition process using gases, such as $N_2$, $SiH_4$, or $NH_3$. In various non-limiting embodiments, the initial second dielectric layer 422 may be formed under a low temperature of less than 350° C. to reduce thermal budget of the active layer of the memory element 114, 214.

Figure 4D:
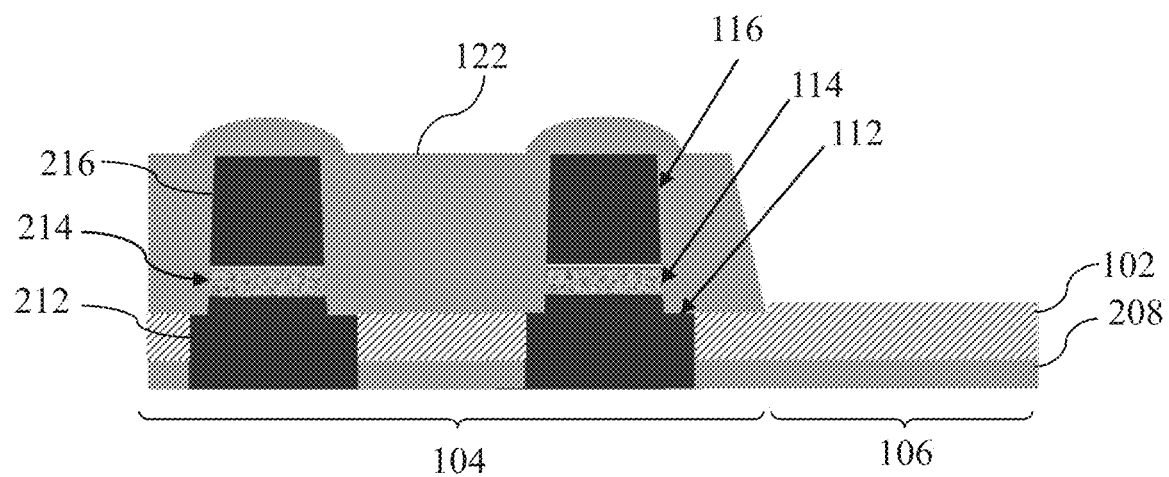

In FIG. 4D, a portion of the initial second dielectric layer 422 over the first region 104 is etched back to form the second dielectric layer 122 surrounding the memory element 114, 214 and surrounding at least a part of the top electrode 116, 216. The initial second dielectric layer 422 over the second region 106 may also be etched back to expose the second region 106 of the first dielectric layer 102. Accordingly, the second dielectric layer 122 is formed only over the first region 104, and is absent over the second region 106.

According to various non-limiting embodiments, after etching back a portion of the initial second dielectric layer 422 over the first region 104, the second dielectric layer 122 may be formed to cover the memory element 114, 214 and the bottom electrode 112, 212. The top surface of the top electrode 116, 216 may or may not be covered by the second dielectric layer 122. After etching back the initial second dielectric layer 422 over the second region 106, the second region 106 of the first dielectric layer 102 may not be covered by the second dielectric layer 122.

According to various non-limiting embodiments, a high selectivity of oxide to initial second dielectric layer (e.g., >10:1) may be provided during the etching back process. In various non-limiting embodiments, the etching back process may include a reactive ion etching process using $CH_3$, $CF_4$, $CHF_3$, $C_4F_8$ or similar gases.

According to various non-limiting embodiments, the etching back process may remove the initial second dielectric layer 422 on top of the top electrode 116, 216 as well as on the second region 106. Compared to chemical mechanical planarization (CMP) which may leave the initial second dielectric layer 422 in the second region 106 due to the height difference between the memory region 104 and the second region 106, the etch back process according to various non-limiting embodiments is above to remove the initial second dielectric 422 on top of the top electrode as well as in the second region 106 such that the second dielectric layer 122 formed therefrom is not present in the second region 106.

In various non-limiting embodiments, a selectivity of higher than 12:1 may be provided, which may leave sufficient first dielectric layer 102 remaining in the second region 106 of the semiconductor device, after etching back the initial second dielectric layer 422 over the second region 106. There may be no other materials, such as stop layers, protective layers or other dielectrics formed to protect the memory element 114, 214 at the end of the etch back process.

According to various non-limiting embodiments of FIG. 4C and FIG. 4D, a thick initial second dielectric layer 422 may be formed with a step coverage of higher than 80% to fully cover the memory cells, and high selective etching back may be applied to remove the initial second dielectric layer capping in the second region 106. Accordingly, a single second dielectric layer 122 may be formed to at least partially encapsulate the memory cells as well as fill the gaps between adjacent memory cells.

Figure 4E:
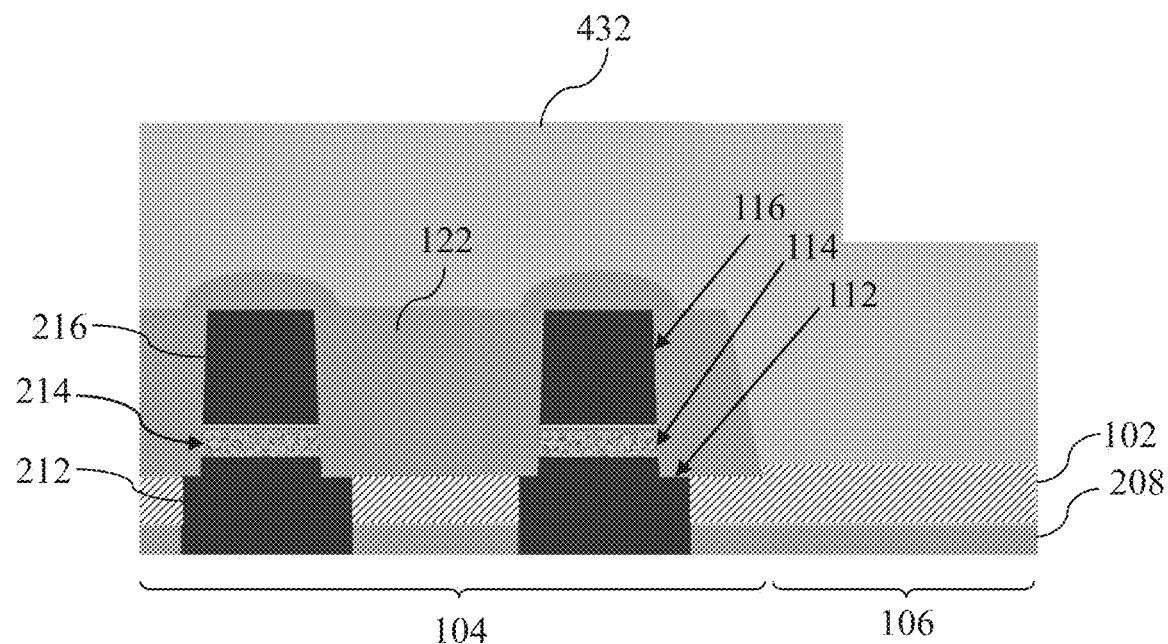

In FIG. 4E, an initial third dielectric layer 432 may be formed over the second dielectric layer 122 and the second region 106 of the first dielectric layer 102. The initial third dielectric layer 432 may include one or more of $SiO_2$, TEOS, SiCOH, or combinations thereof. In various embodiments, the initial third dielectric layer 432 may be in direct contact with the first dielectric layer 102 in the second region 106, where the second dielectric layer 122 is absent. Due to the height difference between the first region 104 and the second region 106, the top surface of the initial third dielectric layer 432 in the first region 104 may be higher than the top surface of the initial third dielectric layer 432 in the second region 106, as shown in FIG. 4E.

Figure 4F:
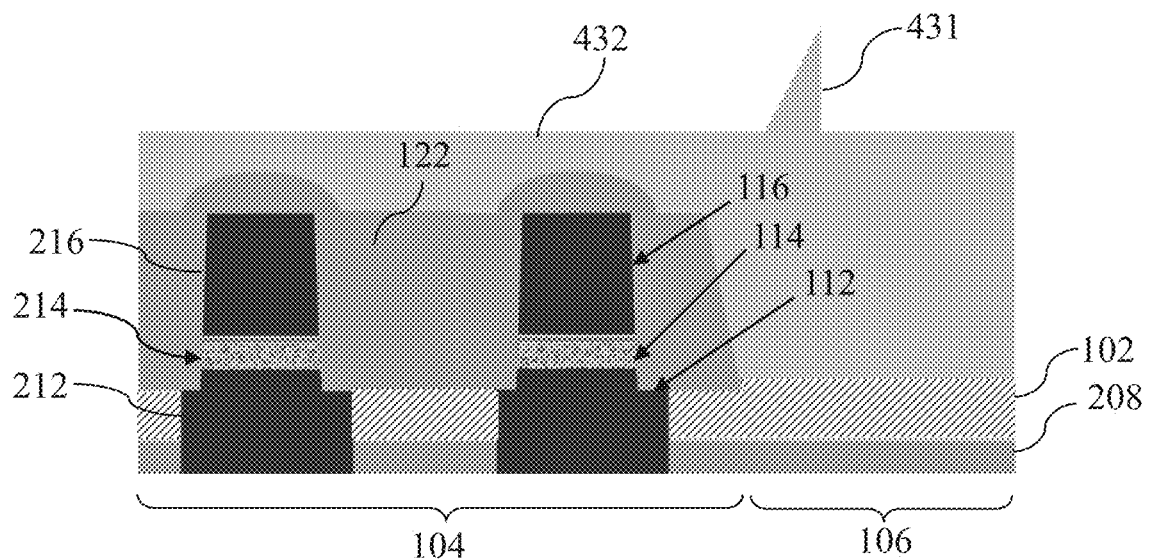

In FIG. 4F, the initial third dielectric layer 432 may be partially removed in a reverse mask process. After the reverse mask process, the top surface of the initial third dielectric layer 432 may be planarized both in the first region 104 and the second region 106. Sparks 431 may be formed on the top surface of the initial third dielectric layer 432.

Figure 4G:
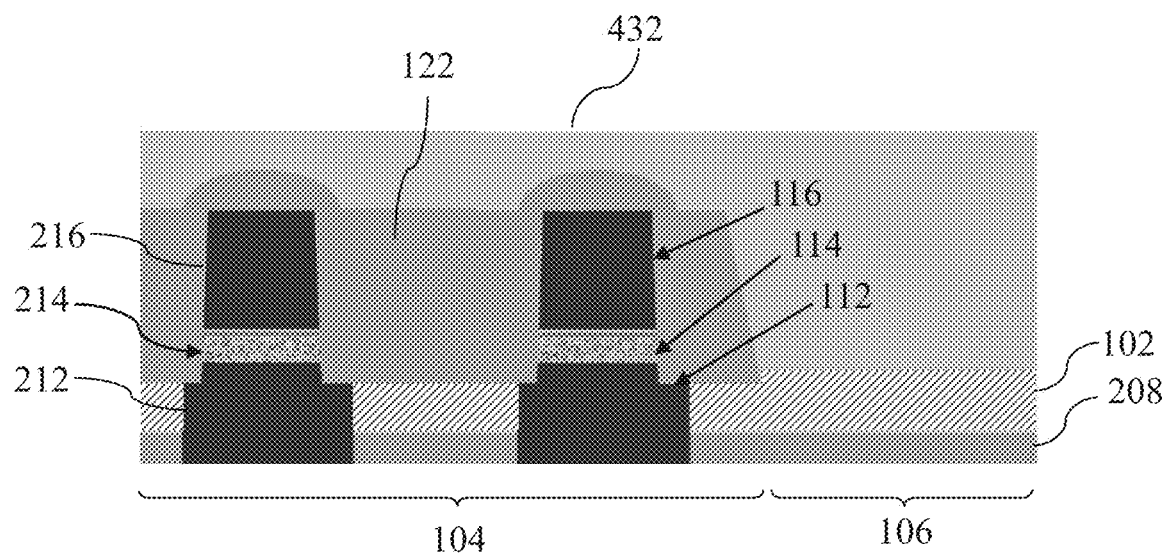

In FIG. 4G, chemical mechanical planarization (CMP) may be performed on the initial third dielectric layer 432 to touch up the top surface of the initial third dielectric layer 432, such that sparks 431 incurred during the reverse mask process may be removed.

Figure 4H:
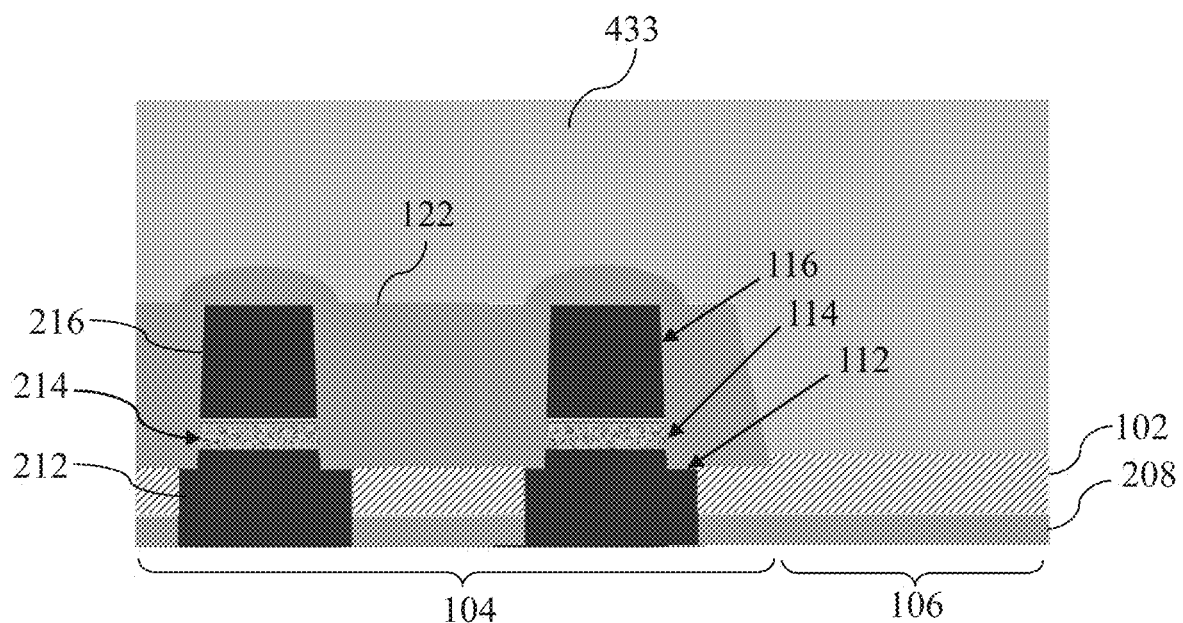

In FIG. 4H, further material of the initial third dielectric layer 432, e.g. SiCOH, may be formed on the initial third dielectric layer 432 to form an intermediate third dielectric layer 433 thicker than the initial third dielectric layer 432.

Figure 4I:
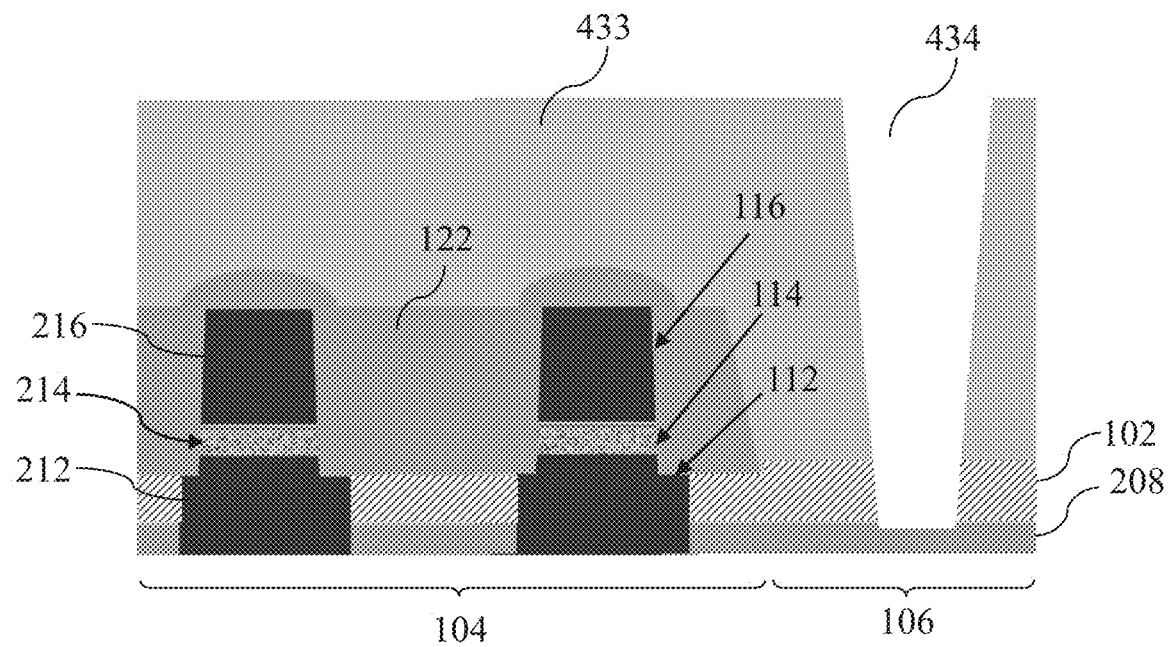

In FIG. 4I, the intermediate third dielectric layer 433 and the first dielectric layer 102 may be partially etched in the second region 106, e.g., using a dual damascene logic via etch process, to form the conductive interconnect structure 434 in the intermediate third dielectric layer 433 and the first dielectric layer 102. In the non-limiting embodiments illustrated in FIG. 4I, the conductive interconnect structure 434 may include a via structure extending through the intermediate third dielectric layer 433 and the first dielectric layer 102.

In conventional methods where a thin encapsulation layer (e.g. a 25 nm SiN layer) may be formed on the first dielectric layer in the second region 106, there may be insufficient etch margin for the thin encapsulation layer landing, and the critical dimension (CD) control may be difficult. The RC (resistive-capacitive) delay may also be out of specification. According to various non-limiting embodiments wherein the second dielectric layer 122 is removed in the second region 106, the etching process in the second region 106 only need to etch the intermediate third dielectric layer 433 and the first dielectric layer 102, which achieves improvement on RC delay performance.

Figure 4J:
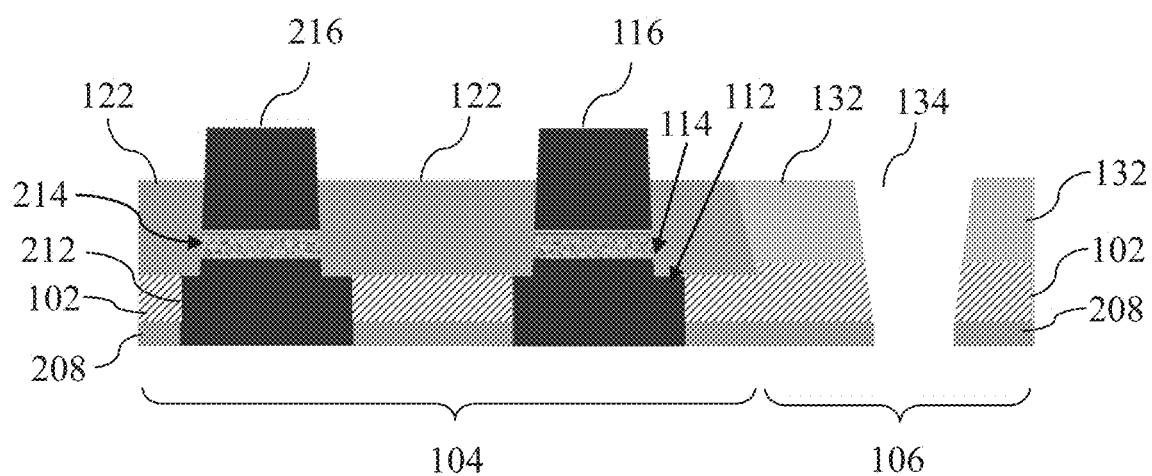

In FIG. 4J, the intermediate third dielectric layer 433 on the first region 104 may be entirely removed, and the second dielectric layer 122 encapsulating the memory cells may be at least partially removed, such that the intermediate third dielectric layer 433 is absent on the first region 104 and the second dielectric layer 122 is formed to surround the memory element 114, 214 and surround at least a part of the top electrode 116, 216. The intermediate third dielectric layer 433 on the second region 106 may be partially removed to form the third dielectric layer 132, wherein the third dielectric layer 132 is arranged over the second region 106 of the first dielectric layer 102 and laterally adjacent to the second dielectric layer 122. The top surface of the second dielectric layer 122 may be co-planar with the top surface of the third dielectric layer 132. Accordingly, a single second dielectric layer 122 may cover and fill the entire memory region 104. The initial third dielectric layer 432 and the intermediate third dielectric layer 433 may be planarly deposited over the whole regions 104, 106. After the etch back process, the third dielectric layer 132 may be formed, only forming a step at the border of the entire memory array.

The portion of the dielectric blocking layer 208 underlying the via structure 434 may also be removed to form the via 134 extending through the third dielectric layer 132 and the second region 106 of the first dielectric layer 102. The portion above the second dielectric layer 122, the third dielectric layer 132 and the via 134 but lower than the top surface of the top electrode 116, 216 may include trenches.

The at least partial removal of the intermediate third dielectric layer 433 and the second dielectric layer 122, as well as the formation of the trenches and the via 134, may be performed, e.g., using a dual damascene logic metal etch process, to form the semiconductor device 200 as shown in FIG. 2.

In conventional methods where a thin encapsulation layer (e.g. a 25 nm SiN layer) may be formed over the memory cells in the first region 104, dual damascene logic metal process with direct landing may not be able to detect the end point of the thin encapsulation layer, since single product transmission ratio is less than about 3.5%. There may be risk in partial short between the adjacent memory cells. According to various non-limiting embodiments where a thick second dielectric layer 122 is arranged over the entire array of memory cells for end of point detection, selectivity between the intermediate third dielectric layer 433 and the second dielectric layer 122 does not need to be considered during the dual damascene logic metal process. The dual damascene logic metal process may have better landing margin even without end point detection. After the dual damascene logic metal process, the second dielectric layer 122 is exposed in the entire memory region 104, and there is no preferential etch in the space between the memory cells.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A semiconductor device comprising:
   a first dielectric layer having a first region and a second region laterally adjacent to the first region;
   a bottom electrode at least partially arranged within the first region of the first dielectric layer;
   a memory element arranged over the bottom electrode;
   a top electrode arranged over the memory element;
   a second dielectric layer arranged over at least the first region of the first dielectric layer, the second dielectric layer surrounding the memory element and surrounding at least a part of the top electrode;
   a third dielectric layer arranged over the second region of the first dielectric layer and laterally adjacent to the second dielectric layer, wherein the third dielectric layer is in physical contact with a top surface of the first dielectric layer;
   a conductive interconnect arranged in the third dielectric layer and the second region of the first dielectric layer; and
   a metal layer covering the top electrode, the second dielectric layer, the third dielectric layer, and the conductive interconnect,
   wherein the second dielectric layer is in physical contact with a side surface of the memory element and a side surface of the top electrode, and wherein the second dielectric layer is in physical contact with an entire side surface of the third dielectric layer; and
   wherein the metal layer extends across the first region and the second region and is in physical contact with the top electrode, the second dielectric layer, the third dielectric layer, and the conductive interconnect.

2. The semiconductor device of claim 1, wherein a top surface of the second dielectric layer is co-planar with a top surface of the third dielectric layer.

3. The semiconductor device of claim 1, wherein the second dielectric layer is in physical contact with the top surface of the first dielectric layer.

4. The semiconductor device of claim 1, wherein the second dielectric layer is surrounding at least one third of a height of the top electrode.

5. The semiconductor device of claim 1, wherein the second dielectric layer is arranged over at least a part of the bottom electrode.

6. The semiconductor device of claim 1, wherein the first dielectric layer comprises at least one of tetraethoxysilane (TEOS), SiCOH, SiN, SiCN, $SiO_2$, or combinations thereof.

7. The semiconductor device of claim 1, wherein the second dielectric layer comprises at least one of SiN, $SiO_yN_z$, $AlO_yN_z$, $TiO_yN_z$, $SiC_yN_z$, MgO, or combinations thereof, wherein $0 \leq y \leq 1$ and $0 \leq z \leq 1$.

8. The semiconductor device of claim 1, wherein the third dielectric layer comprises at least one of $SiO_2$, TEOS, SiCOH, or combinations thereof.

9. The semiconductor device of claim 1, further comprising:
   a dielectric blocking layer arranged under the first dielectric layer, wherein the bottom electrode and the conductive interconnect extend through the dielectric blocking layer.

10. The semiconductor device of claim 1, further comprising:
    a further bottom electrode at least partially arranged within the first region of the first dielectric layer;
    a further memory element arranged over the further bottom electrode;
    a further top electrode arranged over the further memory element;
    wherein the second dielectric layer is arranged surrounding the further memory element and surrounding at least a part of the further top electrode;
    wherein the second dielectric layer is arranged to fill an entire space between the memory element and the further memory element and to at least partially fill a space between the top electrode and the further top electrode.

11. The semiconductor device of claim 1, wherein the memory element comprises a magnetoresistive random access memory, a phase change random access memory, a resistive random access memory, or a ferroelectric random access memory.

12. The semiconductor device of claim 1, wherein the second dielectric layer is arranged to fill an entire space between the memory element and the third dielectric layer.

13. A method of forming a semiconductor device, the method comprising:
    providing a first dielectric layer having a first region and a second region laterally adjacent to the first region;
    forming a bottom electrode at least partially within the first region of the first dielectric layer;
    forming a memory element over the bottom electrode;
    forming a top electrode over the memory element;
    forming a second dielectric layer over at least the first region of the first dielectric layer, the second dielectric layer surrounding the memory element and surrounding at least a part of the top electrode;
    forming a third dielectric layer over the second region of the first dielectric layer and laterally adjacent to the second dielectric layer, wherein the third dielectric layer is in physical contact with a top surface of the first dielectric layer;
    forming a conductive interconnect in the third dielectric layer and the second region of the first dielectric layer; and
    forming a metal layer covering the top electrode, the second dielectric layer, the third dielectric layer, and the conductive interconnect,
    wherein the second dielectric layer is in physical contact with a side surface of the memory element and a side surface of the top electrode, and wherein the second dielectric layer is in physical contact with an entire side surface of the third dielectric layer; and
    wherein the metal layer extends across the first region and the second region and is in physical contact with the top electrode, the second dielectric layer, the third dielectric layer, and the conductive interconnect.

14. The method of claim 13, further comprising forming the second dielectric layer and the third dielectric layer such that a top surface of the second dielectric layer is co-planar with a top surface of the third dielectric layer.

15. The method of claim 13, wherein forming the second dielectric layer further comprises:
    forming an initial second dielectric layer over the first region and the second region of the first dielectric layer,
    configuring a portion of the initial second dielectric layer over the first region to form the second dielectric layer surrounding the memory element and surrounding at least a part of the top electrode, and configuring the initial second dielectric layer over the second region to expose the second region of the first dielectric layer.

16. The method of claim 15, wherein forming the initial second dielectric layer further comprises forming the initial second dielectric layer over the bottom electrode, the memory element, and the top electrode with a step coverage larger than 80%.

17. The method of claim 15, wherein forming the initial second dielectric layer further comprises forming the initial second dielectric layer with a thickness substantially larger than a spacing between the memory element and an adjacent memory element.

18. The method of claim 15, wherein forming the initial second dielectric layer further comprises forming the initial second dielectric layer via cyclic or pulse mode deposition.

\* \* \* \* \*